United States Patent
Joish

(10) Patent No.: US 9,595,937 B2
(45) Date of Patent: Mar. 14, 2017

(54) PROGRAMMABLE STEP ATTENUATOR WITH CROSS CONNECTION

(71) Applicant: Texas Instruments Incorporated, Dallas, TX (US)

(72) Inventor: Rajendrakumar Joish, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/854,083

(22) Filed: Sep. 15, 2015

(65) Prior Publication Data

US 2016/0079959 A1    Mar. 17, 2016

(30) Foreign Application Priority Data

Sep. 17, 2014   (IN) .......................... 4522/CHE/2014

(51) Int. Cl.
*H03H 11/24*   (2006.01)
*H03L 5/00*    (2006.01)
*H03H 7/25*    (2006.01)

(52) U.S. Cl.
CPC .................................. *H03H 7/25* (2013.01)

(58) Field of Classification Search
USPC ................................ 327/306, 308; 333/81 R
See application file for complete search history.

(56) References Cited

U.S. PATENT DOCUMENTS

| | | | |
|---|---|---|---|
| 4,319,184 A | 3/1982 | Kowalczyk | |
| 6,127,893 A * | 10/2000 | Llewellyn | H03G 3/001 330/254 |
| 6,288,669 B1 | 9/2001 | Gata | |
| 6,542,018 B1 | 4/2003 | Yin | |
| 7,899,426 B2 * | 3/2011 | Tasic | H04B 1/30 455/286 |
| 8,301,186 B2 | 10/2012 | Gorbachov | |
| 2014/0266518 A1 | 9/2014 | Wang et al. | |

* cited by examiner

*Primary Examiner* — Dinh T Le
(74) *Attorney, Agent, or Firm* — Tunelap D. Chan; Charles A. Brill; Frank D. Cimino

(57) ABSTRACT

Disclosed examples include a programmable attenuator circuit providing selective cross coupling of impedance components between circuit input nodes and output nodes according to control signals to set or adjust an attenuation value of the attenuator circuit. The attenuator circuit includes a plurality of attenuator impedance components, and a switching circuit to selectively connect at least a first attenuator impedance component between the first input node and the second output node, to selectively connect at least a second attenuator impedance component between the second input node and the first output node, to selectively connect a third attenuator impedance component between the first input node and the first output node, and to selectively connect a fourth attenuator impedance component between the second input node and the second output node.

13 Claims, 5 Drawing Sheets

PROGRAMMABLE STEP ATTENUATOR WITH CROSS CONNECTION

REFERENCE TO RELATED APPLICATION

This application claims, under 35 U.S.C. §119, priority to, and the benefit of, Indian provisional application number 4522/CHE/2014, entitled "A NOVEL IMPLEMENTATION OF A RESISTOR ATTENUATOR USING CROSS CONNECTION", and filed in India on Sep. 17, 2014, the entirety of which is hereby incorporated by reference.

TECHNICAL FIELD

The present disclosure relates to attenuators, and more particularly programmable step attenuator circuits.

BACKGROUND

Attenuator circuits are used in a variety of situations to control the amplitude of an analog signal provided to the input of a subsequent circuit. For example, analog to digital converters (ADCs) convert received analog signals within a defined signal range, and analog front end signal conditioning circuits with attenuators may be used to adapt an input signal to best use the conversion range of the ADC. Automatic gain control (AGC) circuits may be used in connection with adjustable attenuator circuits to dynamically set an attenuation value to optimize the usage of the ADC input range for varying input signal amplitudes. Step attenuators provide for attenuation adjustment in steps or increments, allowing digital implementation of programmable attenuators and AGC circuits. Digital step resistor attenuators are generally of two forms, including series and parallel architectures.

FIG. 7 shows a series resistor step attenuator circuit 700 that receives an input signal from an AC signal source 702 having source resistances RS. The attenuator 700 includes resistive divider circuits for attenuating a positive or plus signal IN+ and a negative or minus input signal IN−. The upper divider circuit includes a first resistor R1A and a resistor ladder circuit including series-connected resistors with individual values R. Similarly, the lower divider circuit includes a first resistor R1B connected in series with a number of resistors with individual values R. Switches individually connect midpoints between the series connected resistors of each ladder circuit with a corresponding output line OUT+, OUT−. The resistive divider circuit 700 allows programmable attenuation of the input signal VIN to provide an output signal at the lines OUT+ and OUT−. The series resistive step attenuator circuit 700 in FIG. 7 provides a generally constant input port voltage reflection coefficient scattering parameter, or "S-parameter" value S11. However, the series step attenuator 700 suffers from switch reliability problems, particularly for higher attenuation settings. In particular, the highest attenuation setting involves closure of the lowest switches in each of the ladder circuits. In this condition, the uppermost switch in each ladder circuit sees a relatively large voltage swing. For field effect transistor switches, this means that the upper switch transistor sees a much larger drain-source voltage swing VDS, gate-source voltage swing VGS and gate-drain voltage swing (VGD) than do the other switches. As a result, the upper switch may experience reliability problems, and due to large voltage swings across upper switches, there will be parasitic capacitive non-linearities that will degrade the performance of the attenuator.

FIG. 8 shows a parallel resistor step attenuator circuit 800 which receives an input signal from a signal source 802 with source resistances RS. The parallel attenuator 800 in FIG. 8 includes upper and lower first resistors R1A and R1B connected to the IN+ and IN− lines to receive the input voltage VIN. The circuit 800 also includes a number of parallel switched resistor branches connected between plus and minus output lines OUT+ and OUT−. In this example, each branch circuit includes a switch and a pair of resistors having a value R. Closing successively more of the switches of the parallel switch resistor branches causes a stepwise decrease in the amount of attenuation. The switches in the parallel attenuator circuit 800 typically do not suffer from reliability problems as was the case for the series attenuator 700. However, the reflection coefficient S11 varies significantly across attenuator settings in the parallel attenuator 800. In this regard, many applications have a maximum S11 specification, such as S11<−9 dB, and achieving this performance is difficult with the parallel attenuator 800 across all possible attenuation settings. In addition, resistance values become very small at high attenuation settings in the parallel configuration 800, and thus large switch sizes (e.g., transistor sizes) are necessary to reduce switch resistance. Larger switch size results in larger circuit area and larger parasitic capacitances of the larger transistors, leading to S11 degradation, and reduced input bandwidth. Because of this, operation at reduced S11 values is also difficult across all attenuation settings for the parallel step attenuator 800.

SUMMARY

Described examples include an attenuator circuit including first and second input nodes to receive an input signal, as well as first and second output nodes to provide an output signal. The attenuator circuit also includes a plurality of attenuator impedance components, and a switching circuit to connect at least a first attenuator impedance component between the first input node and the second output node, to connect at least a second attenuator impedance component between the second input node and the first output node, to connect a third attenuator impedance component between the first input node and the first output node, and to connect a fourth attenuator impedance component between the second input node and the second output node. The switching circuit in one example includes an output impedance component coupled between the first and second output nodes. The output and attenuator impedance components can be resistors or capacitors in certain examples.

DETAILED DESCRIPTION

Figure 1:
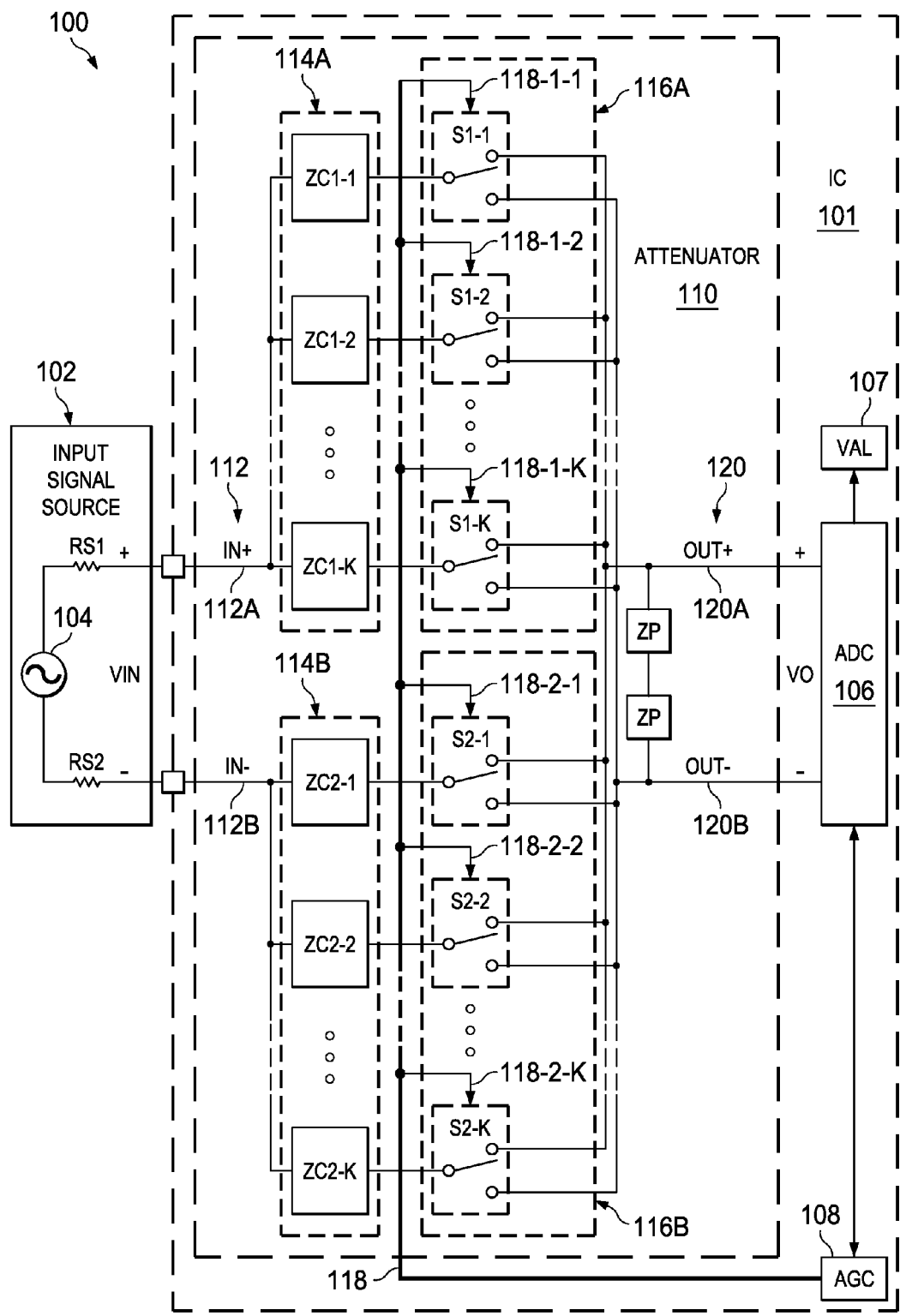
FIG. 1 is a schematic diagram of a programmable step attenuator circuit with selectable direct or cross-coupled impedance elements.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 shows a system 100 including an integrated circuit (IC) 101 with a programmable step attenuator circuit 110 having a plurality of selectable direct or cross-coupled impedance elements ZC. The attenuator circuit 110 receives an input signal via input terminals of the IC 101. In one example, the input signal is a differential AC voltage signal VIN from an input signal source 102. The input signal source 102 includes a voltage source 104 and source resistances RS1 and RS2. The attenuator circuit 110 receives the input signal VIN from the source 102 along first and second input nodes 112A and 112B forming an input circuit 112 of the attenuator circuit 110. The first input node 112A receives a first input voltage signal IN+, and the second input node 112B receives a second input voltage signal IN−. The input voltage signals IN+ and IN− form the differential voltage input signal VIN. In other examples, a single ended attenuator circuit 110 (not shown) can be used for attenuating a single ended input signal. The attenuator 110 includes an output circuit 120 with first and second output nodes 120A and 120B. The output circuit 120 includes a first output node 120A that provides a first output signal OUT+, and a second output node 120B that provides a second output signal OUT−. The first and second output signals OUT+ and OUT− form a differential output voltage signal VO.

The example IC 101 includes an analog to digital converter (ADC) 106 that converts the differential output signal VO and provides a corresponding digital value 107 (labeled VAL in the drawing). In one example, the IC 101 includes output terminals (not shown) to provide the converted digital value 107 to an external system component, such as a host processor (not shown). In another example, the IC 101 includes processing circuits (not shown) that receive the digital value 107 from the ADC 106. The IC 101 also includes an automatic gain control (AGC) circuit 108 that generates switching control signals 118 to set the attenuation value $\alpha$ of the attenuator circuit 110. In one example, the attenuation $\alpha$ is represented as the ratio of the amplitude of the output signal VO divided by the amplitude of the input signal VIN. The attenuation $\alpha$ may also be expressed in decibels as $20 \log_{10}$ VO/VIN. In one example, the ADC 106 provides a feedback signal or control signal to the AGC 108 indicating the amplitude of the converted output signal VO. The AGC 108 generates the control signals 118 in a closed loop fashion to adjust the attenuation $\alpha$ of the attenuator circuit 110 by selectively increasing the attenuation $\alpha$ to prevent exceeding the input voltage range of the ADC 106, and by selectively decreasing the attenuation $\alpha$ to preferentially use as much of the input voltage range of the ADC 106.

The attenuator circuit 110 includes a plurality of attenuator impedance components ZC. In one example, the impedance components ZC form a first impedance circuit 114A and a second impedance circuit 114B. The first impedance circuit 114A in the example of FIG. 1 includes an integer number "K" first attenuator impedance components ZC1-1, ZC1-2, . . . , ZC1-K. K can be any integer value greater than 1. Each of the first attenuator impedance components ZC1 includes first and second terminals, with the first terminal of the components ZC1 connected to the first input node 112A. The second impedance circuit 114B in this example includes an integer number "K" second impedance components ZC2 (e.g., ZC2-1, ZC2-2, . . . , ZC2-K). The individual second impedance components ZC2 include third and fourth terminals. The third terminals of the components ZC2 are coupled with the second input node 112B. The attenuation circuit 110 also includes at least one output impedance component ZP coupled between the first and second output nodes 120A and 120B. In the example of FIG. 1, two output impedance components ZP are connected in series with one another between the output terminals 120A and 120B. In another example, a single impedance component ZP can be used, or more than two output impedance components ZP can be connected in any series and/or parallel arrangement between the output terminals 120A and 120B.

Any suitable attenuation and output impedance components ZC, ZP can be used which provide an electrical impedance between two terminals or nodes. In one example, the attenuator impedance components ZC have generally equal impedance values. In another example, the attenuator impedance components ZC of the impedance circuits 114 can have different impedance values. The output impedance component or components ZP connected across the output circuit 120 have a generally equal impedance value to the attenuator impedance components ZC in one example. In other examples, the output impedance component or components ZP can have a different impedance value from the attenuator impedance components ZC.

Figure 6:
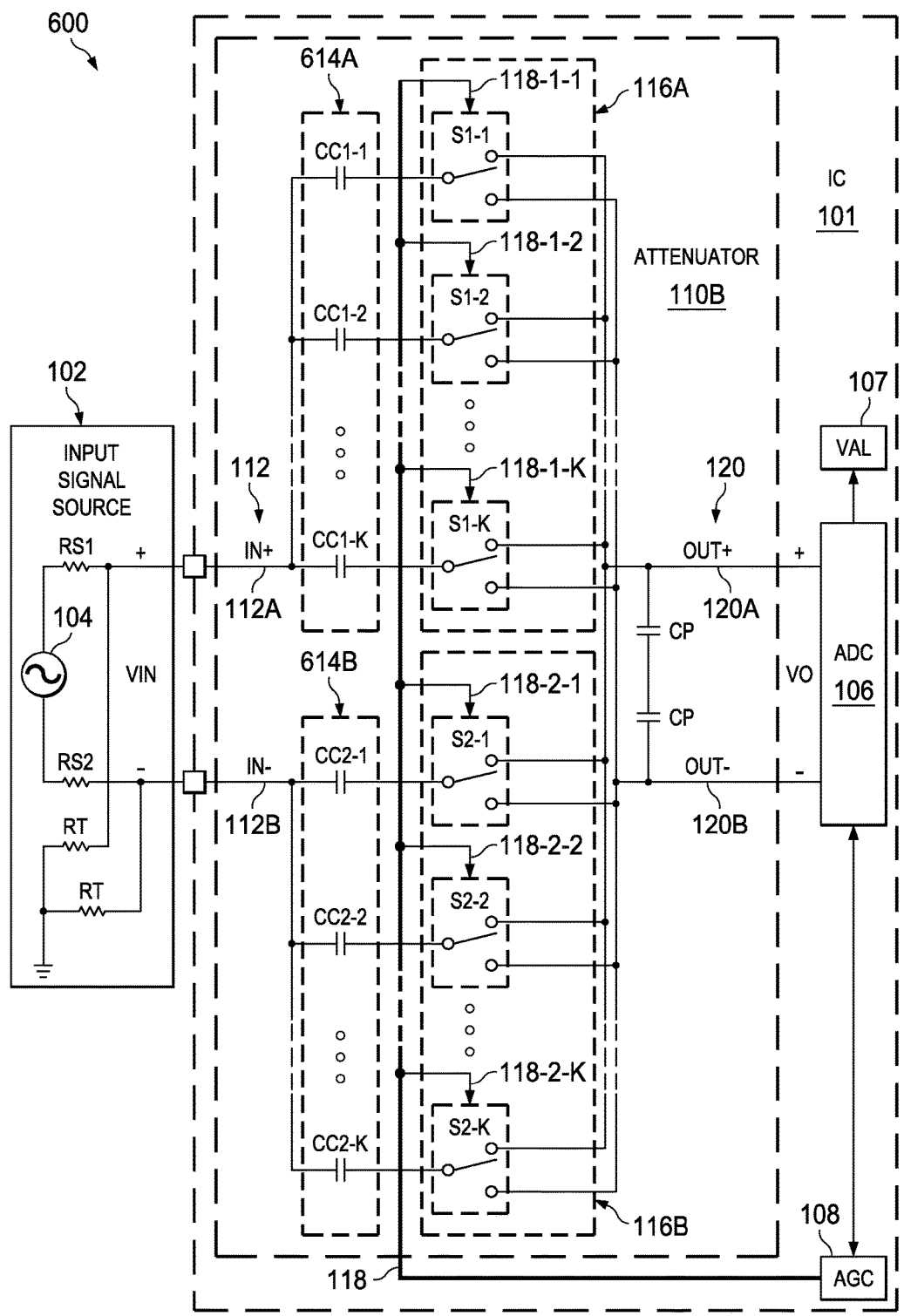
FIG. 6 is a schematic diagram of another programmable step attenuator circuit example with selectable direct or cross-coupled capacitors.

In addition, any suitable type of impedance component can be used, or multiple impedance types can be used for the attenuation impedance components ZC and/or the output impedance component or components ZP. For example, resistor components can be used as shown below in FIG. 2. In another example, capacitor components can be used as seen in FIG. 6 below. In addition, although individual attenuator and output impedance components are shown in the figures, the individual attenuator impedance components ZC and/or the output impedance components ZP can be formed by any suitable interconnection of two or more impedance components, including series connection, parallel connection and/or combinations of series/parallel configurations to form a given one of the impedance components ZC or ZP to provide an electrical impedance between two terminals.

The attenuator circuit 110 also includes a plurality of switching circuits S1 and S2 forming switching circuitry 116. The individual switching circuits S1 in one example are formed into a first switching circuit 116A coupled between the first impedance circuit 114A and the output circuit 120. A second switching circuit 116B includes switching circuits S2 coupled between the second impedance circuit 114A and the output circuit 120. The first switching circuit 116A includes an integer number "K" switches S1-1, S1-2, . . . , S1-K operated according to corresponding switching control signals 118-1-1, 118-1-2, . . . , 118-1-K from the gain control circuit 108, respectively. Similarly, the second switching circuit 116B includes "K" switches S2-1, S2-2, . . . , S2-K operated according to corresponding switching control signals 118-2-1, 118-2-2, . . . , 118-2-K. The switching circuits 116 allow selective direct connection of one or more of the attenuator impedance components ZC between the upper input and output nodes 112A, 120B, as well as direct connection of one or more attenuator impedance components ZC between the lower input node 112B and the lower output node 120B.

Figure 3:
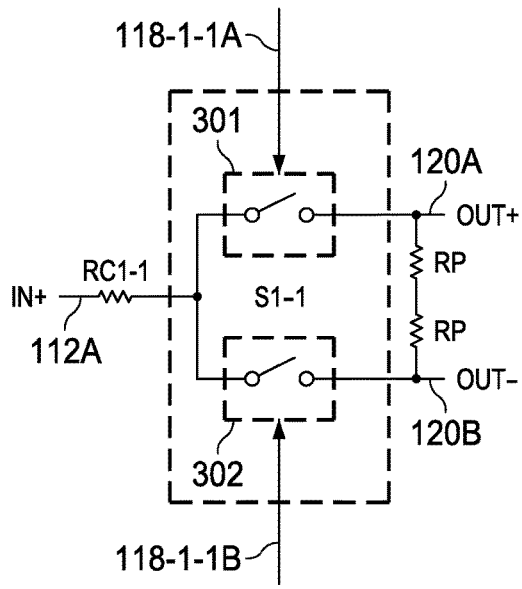
FIG. 3 is a schematic diagram of an example switching circuit in the attenuator of FIG. 2.

The configuration of the switching circuits 116A and 116B provides for cross-coupling of one or more of the attenuator impedance components ZC between the upper input node 112A and the lower output node 120B, and also allows cross coupling of one or more components ZC between the lower input node 112B and the upper output node 120A. The individual switching circuits S1, S2 in one example provide two selectable states. In a first state, the corresponding impedance component ZC is directly coupled. In a second state, the corresponding attenuation impedance component ZC is cross-coupled between the connected input node 112A or 112B and the complementary or opposite output node 120B or 120A. This individual switching circuit functionality can be implemented in any suitable fashion, for example, using a pair of switches 301, 302 as illustrated and described below in connection with FIG. 3 for the individual switch circuits S1 and S2. The gain control circuit 108 may provide a single control signal 118 to each of the individual switching circuits S1 and S2 in one example. In another example, as seen in FIG. 3 below, the individual switch circuits S1 and S2 receive multiple control signals 118 from the gain control circuit 108 in order to implement the two operating states. Hereinafter, the control signals 118 are referred to in the singular, although the individual control signal 118 may include multiple signals for a single switch circuit S1, S2.

Figure 7:
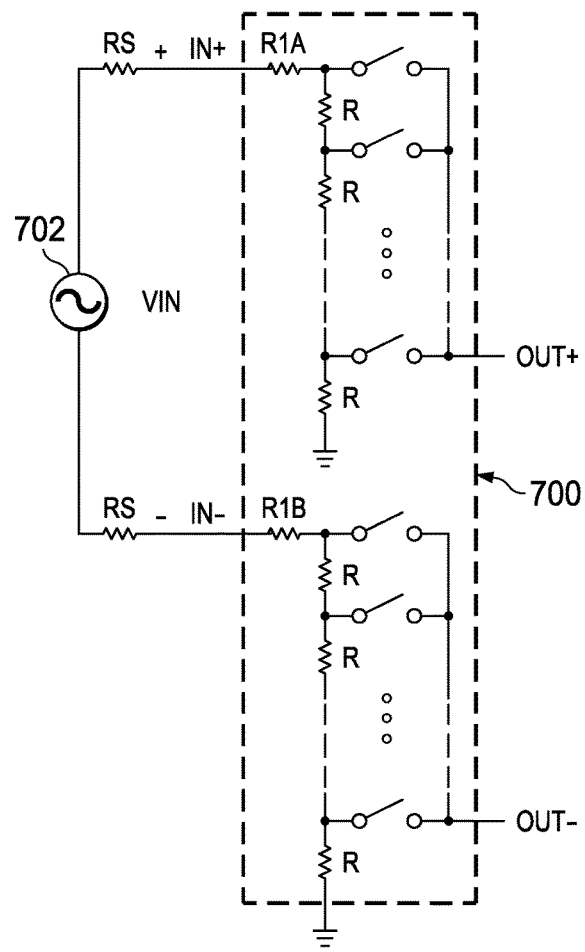
FIG. 7 is a schematic diagram of a series resistor attenuator circuit.

In one example, the gain control circuit 108 provides the control signals 118 to selectively connect at least a first one of the first attenuator impedance components ZC1 between the first input node 112A and the second output node 120B. In this manner, a programmable impedance is coupled between the "plus" input node 112A and the "minus" output node 120B. In addition, the gain control circuit 108 provides the control signals 118 in one example to selectively connect at least a second one of the attenuator impedance components ZC2 between the second input node 112B and the first output node 120A. This cross-coupling from plus to minus and/or from minus to plus allows adjustment of the attenuation value α of the attenuation circuit 110, while mitigating or avoiding one or more of the shortcomings of the series attenuator 700 shown in FIG. 7 and the parallel attenuator 800 shown in FIG. 8.

In one example, the switching circuit 116 is also operative according to the control signals 118 from the gain control circuit 108 to selectively connect at least a third one of the attenuator impedance components ZC1 between the "plus" first input node 112A and the "plus" first output node 120A, and to selectively connect at least a fourth one of the attenuator impedance components ZC2 between the "minus" second input node 112B and the "minus" second output node 120B. In this manner, the control signals 118 can be used to provide a variety of different direct impedance (e.g., plus to plus and/or minus to minus) in combination with one or more cross-coupled attenuator impedances ZC (e.g., plus to minus and/or minus to plus).

In the example of FIG. 1, the individual switching circuits S1 are coupled with a corresponding one of the first impedance components ZC1. The switching circuits S1 are selectively operative according to the corresponding switching control signal or signals 118-1 to electrically connect the second terminal of the corresponding first impedance component ZC1 to the first output node 120A when the corresponding first control signal 118-1 is in a first state. When the corresponding signal 118-1 is in a second state, the individual switching circuits S1 electrically connect the corresponding first impedance component ZC1 to the second output node 120B. The individual second switching circuits S2 in this example operate in similar fashion to electrically connect the corresponding impedance component ZC2 to the first output node 120A when a corresponding second control signal 118-2 is in a first state, and to electrically connect the corresponding component ZC2 to the second output node 120B when the corresponding second control signal 118-2 is in a second state.

Figure 2:
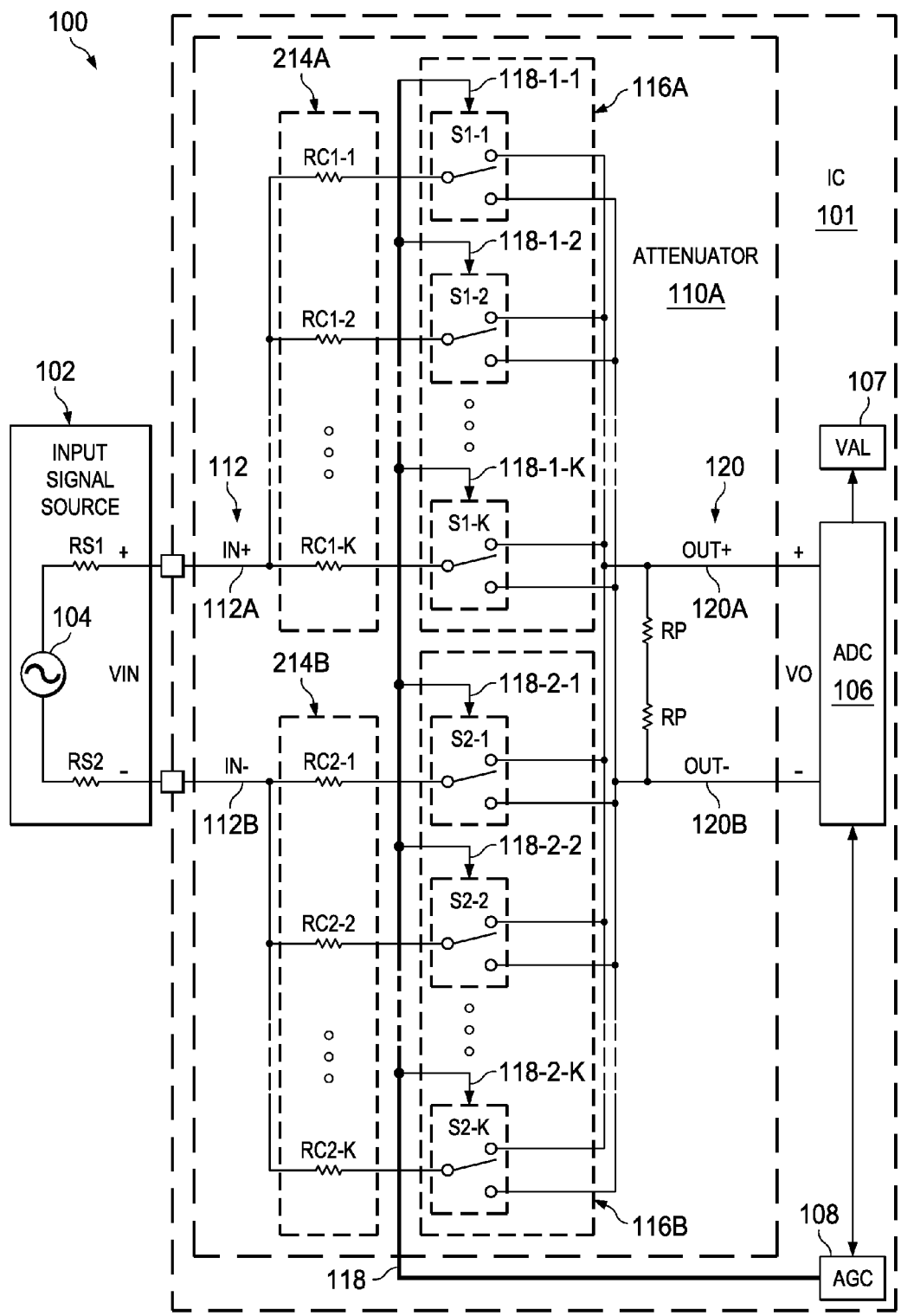
FIG. 2 is a schematic diagram of another programmable step attenuator circuit example with selectable direct or cross-coupled resistor elements.

FIG. 2 shows another example IC 101 with a programmable step attenuator circuit 110A including resistive attenuator impedance circuits 214. In this case, a first impedance circuit 214A includes resistors RC1-1, RC1-2, . . . , RC1-K and a second attenuation impedance circuit 214B includes "K" resistors RC2-1, RC2-2, . . . , RC2-K. The circuit 110A generally operates as described above in connection with the attenuator 110 of FIG. 1, with the switching circuits 116 selectively connecting one or more of the resistive components RC from the input circuit 112 to the output circuit 120 from plus to plus, from minus to minus, from plus to minus or from minus to plus. As described above, the gain control circuit 108 in the example of FIG. 2 provides the switching control signals 118 to operate each of the individual switch circuits S1, S2 in one of two states. In addition, the output impedances are also resistors RP. The illustrated example includes two series connected resistors RP. A single resistor RP can be used in other examples.

FIG. 3 shows an example switching circuit S1-1 in the attenuator of FIG. 2, implemented using a first switch 301 and a second switch 302. Although FIG. 3 shows only a single one of the individual switching circuits (e.g., S1-1), similar structure can be used to form the other individual switching circuits S1, S2 in the above attenuator circuits 110 in certain examples. As shown in FIG. 3, the first switch 301 is coupled between the corresponding impedance component RC1-1 and the first output node 120A. The second switch 302 is coupled between RC1-1 and the second output node 120B. The first switch 301 receives a control signal 118-1-1A, and the second switch 302 receives a control signal 118-1-1B from the gain control circuit 108. In one example, the switches 301 and 302 are implemented using field effect transistors.

When the first switch 301 is closed (e.g., low impedance) and the second switch 302 is open (e.g., high impedance) according to the signals 118-1-1A and 118-1-1B, the switch circuit S1-1 is in a first state. In the first state, the corresponding resistive impedance component RC1-1 is connected between the "plus" input node 112A and the "plus" output node 120A. A second switching circuit state is provided when the first switch 301 is open according to the signal 118-1-1A and the second switch 302 is closed according to the signal 118-1-1B. In the second state, the impedance RC1-1 is cross-coupled between the "plus" input node 112A and the "minus" output node 120B. In one example, the other switching circuits S1 and S2 in FIG. 2 are constructed in similar fashion.

Figure 4:
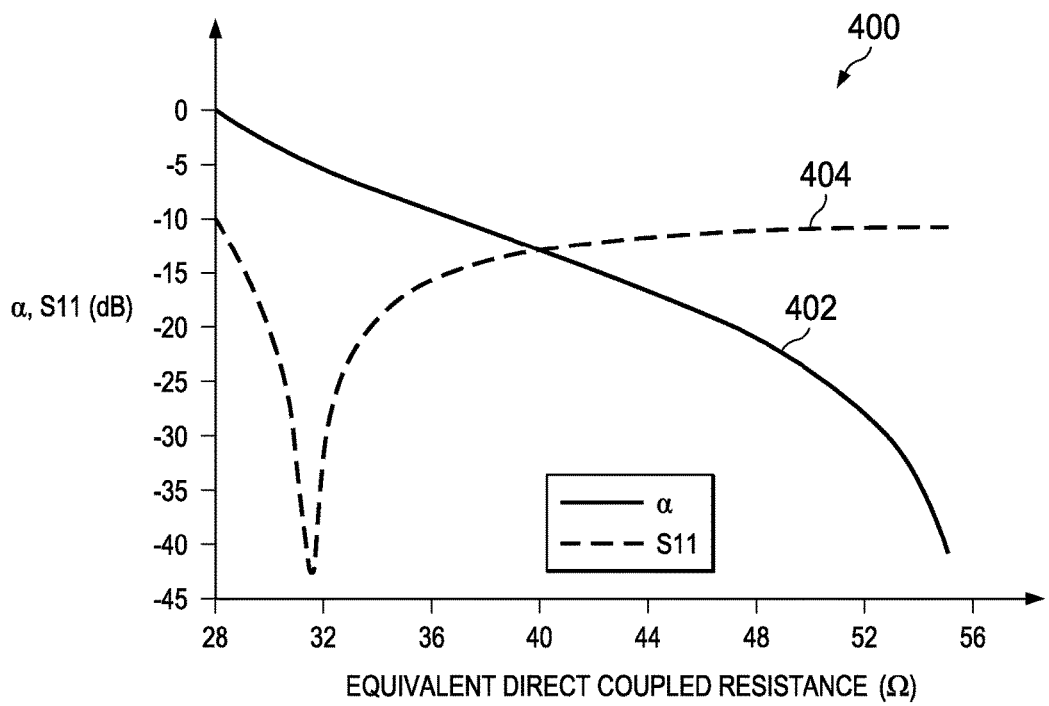
FIG. 4 is a waveform diagram showing input attenuation and return loss scattering parameter performance of the step attenuator circuit of FIG. 2 as a function of equivalent cross-coupled resistance.
Figure 5:
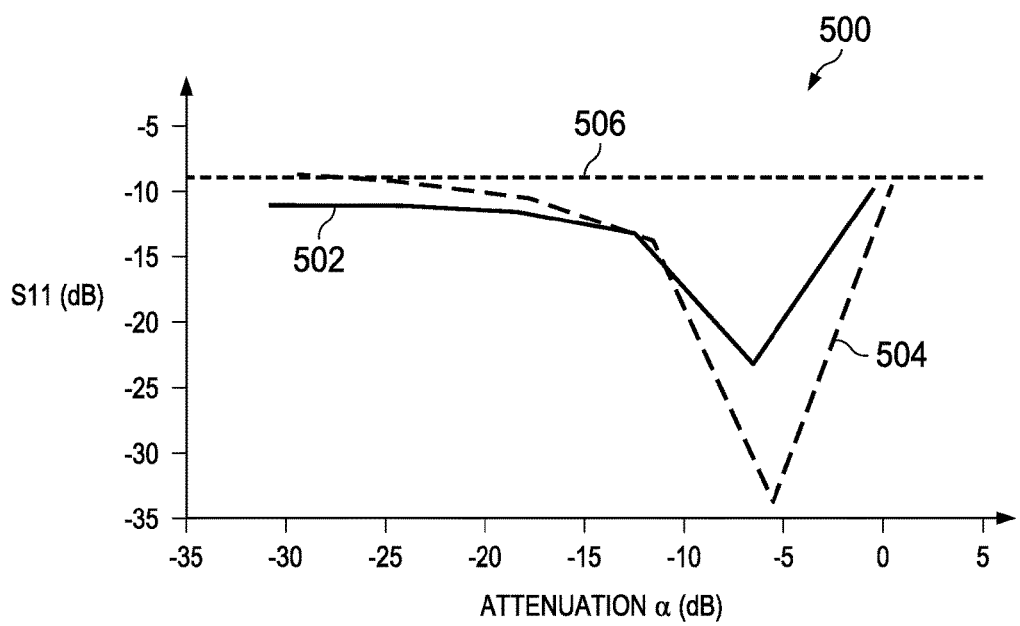
FIG. 5 is a waveform diagram showing return loss scattering parameter performance of the attenuator circuit of FIG. 2 as a function of input attenuation.

Referring now to FIGS. 2, 4 and 5, the gain control circuit 108 can provide the control signals 118 to implement a variety of different resistive cross-connections (e.g., plus to minus and/or minus to plus) alone or in combination with direct impedance connections. The amount of cross coupling and direct coupling controls the attenuation value α of the attenuator circuit 110.

FIG. 4 is a waveform diagram 400 showing input attenuation α 402 and the S11 return loss scattering parameter 404 in dB in an example of the step attenuator circuit 110A of FIG. 2 as a function of equivalent direct coupled resistance (Ω). In one example, the source resistance RS=50 ohms, an output resistance value RP=70 ohms (e.g., two RPs connected in series), and the total effective parallel resistance of the attenuator network RC=28 ohms. Although the curves 402 and 404 are shown as calculated smooth curves, the operation of the switching circuits 116 by the control signals 118 in the step attenuator circuit 110A will provide a number of discrete settings of the direct and cross-coupled impedances, each having a corresponding attenuation value α and S11 parameter. As seen in FIG. 4, the attenuation curve 402 decreases with increasing equivalent direct-coupled resistance. This allows the gain control circuit 108 to selectively provide the control signals 118 to set an appropriate attenuation to best utilize the conversion signal input range of the ADC 106.

The following Table 1 shows attenuation operation of an example circuit for K=6 with six upper switch circuits S1 and six lower switch circuits S2. In this example, RC1 is the effective direct coupling resistance, and RC2 is the effective cross coupling resistance. The switch states for the upper switch circuits S1 are shown in the table having a value "HI" indicating the switch connects the corresponding impedance to the upper output 120A, and "LO" indicating that the switch connects the corresponding impedance to the lower output terminal 120B, where the lower switch circuits S2 are operated using corresponding switch settings to achieve the resulting attenuations α:

TABLE 1

| RC1 (Ω) | RC2 (Ω) | S1-1 | S1-2 | S1-3 | S1-4 | S1-5 | S1-6 | Attenuation α (dB) |
|---|---|---|---|---|---|---|---|---|
| 28.0 | N/A | HI | HI | HI | HI | HI | HI | −0.52 |
| 32.8 | 191.8 | LO | HI | HI | HI | HI | HI | −6.57 |
| 39.4 | 96.8 | LO | LO | HI | HI | HI | HI | −12.59 |
| 45.6 | 72.5 | LO | LO | LO | HI | HI | HI | −18.45 |
| 50.0 | 63.6 | LO | LO | LO | LO | HI | HI | −24.18 |
| 53.0 | 59.4 | LO | LO | LO | LO | LO | HI | −30.75 |

Figure 8:
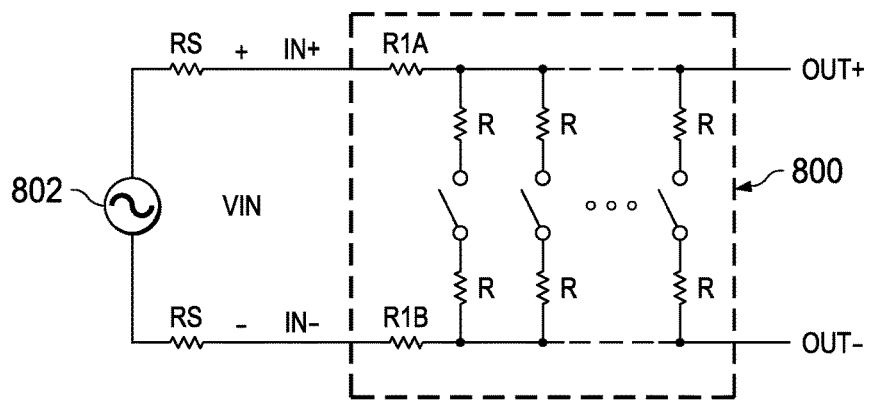
FIG. 8 is a schematic diagram of a parallel resistor attenuator circuit.

FIG. 5 is a waveform diagram 500 showing the S11 return loss scattering parameter 502 performance of the attenuator circuit example 110A in FIG. 2 and the S11 parameter 504 in the parallel attenuator 800 in FIG. 8, both shown as a function of input attenuation α (dB). As shown in FIG. 5, the S11 return loss scattering parameter performance curve 502 for the resistive cross-coupled attenuator circuit 110A remains well below a −9 dB specification limit 506 across the attenuation range 0 dB>α>−30 dC, whereas the curve 504 for the conventional parallel attenuator 800 does not meet the specification 506 at low or high attenuations.

The attenuation value α of the attenuator circuit 110A in FIG. 2 is set by controlled connection of cross-coupled resistance through control signals 118. For a single ended input VIN, the attenuation α in the circuit 110A in one example is proportional to difference between the reciprocal of the effective resistance connected directly and reciprocal of the effective resistance that is cross coupled as per equation (1) below. In one single-ended example, the second impedance circuit 214B and the second switching circuit 116B in FIG. 2 can be omitted. For a single-ended general impedance switched attenuation, the first impedance circuit 114A and the first switching circuit 116B can be omitted in FIG. 1. For a differential input, as shown in FIG. 2, the attenuation value α is set by the difference between the reciprocals of the direct and cross-coupled resistances. In this example, the resistor values need not be small, and hence the switch on-state resistances (e.g., RDSON for FET switches) do not significantly impact the attenuation or S11 performance over a wide range of attenuation settings, even for relatively small switch sizes. In addition, as shown in FIGS. 4 and 5, the S11 variation is acceptable and remains less than −9 dB for all attenuations. In addition, none of the switches (e.g., 301 or 302 in FIG. 3) experience high off-state voltage swings (e.g., VDS for PET switches). Consequently, reliability problems are mitigated or avoided and due to low swings across all switches, linearity is inherently better than the parallel resistive attenuator circuit 800 in FIG. 8.

For a simple case of two resistors in the circuit 110A of FIG. 2, RC1 is the effective resistance connected from the first (e.g., plus) input node 112A to the first (e.g., plus) output node 120A, and RC2 is the effective cross-coupled resistance connected from the input node 112A to the second (e.g., minus) output node 120B, where the switch resistances are included in the values for RC1 and RC2. In this example, the switches 301 and 302 are sized such that the on state resistance contributes 9% of the total resistance of the corresponding resistance element.

The circuit attenuation value α in this example is given according to the following equation (1):

$$\alpha = V_{out}/V_{in} = \frac{g_s(g_{c1} - g_{c2})}{(g_p g_s + (g_p + g_s)(g_{c1} + g_{c2}) + 4g_{c1}g_{c2})} \quad (1)$$

where $g_s=1/RS$, $g_{c1}=1/RC1$, $g_{c2}=1/RC2$, and $g_p=1/RP$.

The port voltage reflection coefficient scattering parameter S11 (dB) for the circuit 110A in FIG. 2 is given by the following equation (2):

$$s_{11} = 20\log_{10}\left|1 - \frac{2g_s(g_p + g_{c1} + g_{c2})}{(g_p g_s + (g_p + g_s)(g_{c1} + g_{c2}) + 4g_{c1}g_{c2})}\right| \quad (2)$$

In one implementation, $g_{c1}+g_{c2}=g_c=+1/RC=a$ constant, a source resistance RS=50 ohms, an output resistance value RP=70 ohms, and RC=28 ohms. The value of RC1 is increased by cross-coupling part of RC to the opposite side to get more attenuation (e.g., plus to minus or minus to plus or both, identified hereinafter as ΔRC1, which is the incremental amount of resistance that gets transferred from direct connection to cross connection when the attenuation settings are successively changed). Table 2 shows attenuation α and S11 values in dB for various example values of RC1 and ΔRC1 corresponding to the curves 402 and 404 in FIG. 4.

TABLE 2

| RC1 (Ω) | ΔRC1 (Ω) | α (dB) | S11 (dB) |
|---|---|---|---|
| 28.00 | — | −0.52 | −9.82 |
| 32.80 | 191.80 | −6.57 | −23.26 |
| 39.40 | 195.81 | −12.59 | −13.21 |
| 45.60 | 289.78 | −18.45 | −11.55 |
| 50.00 | 518.18 | −24.18 | −11.14 |
| 53.00 | 883.33 | −30.75 | −11.03 |

As seen in Table 2 and FIG. 4, the values of ΔRC1 are relatively high compared with the RDSON of relatively small FET transistor switches across the entire attenuation range from 0 dB to −40 dB. Therefore, the switches (e.g., 301 and 302 in FIG. 3 above) do not need to be oversized. In this manner, the resistive step attenuator circuit 110A occupies only a small die area of the integrated circuit 101, and the undesirable parasitics and bandwidth reduction associated with large switches can be avoided. Also, the S11 curve stays below the −9 dB value, even at high attenuation settings. For the attenuation range from 0 dB to −30 dB, the total switch size in one example of the circuit 110A in FIG. 2 is around 3.5× smaller than conventional parallel attenuator circuit 800 in FIG. 8.

In contrast, Table 2 below shows attenuation α and S11 values for different parallel resistance values in the parallel attenuator 800 in FIG. 8. In this case, RS=50 ohms, R1A=R1B=22 ohms, and RP (the sum of the connected resistors R) is decreased for more attenuation by closing more switches to add parallel resistor elements (ΔRP).

TABLE 3

| RP (Ω) | ΔRP (Ω) | α (dB) | S11 (dB) |
|---|---|---|---|
| 82.00 | — | 0.53 | −9.10 |
| 26.00 | 38.07 | −5.53 | −33.80 |
| 11.00 | 19.07 | −11.55 | −13.77 |
| 5.00 | 9.17 | −17.75 | −10.50 |
| 2.40 | 4.62 | −23.83 | −9.27 |
| 1.25 | 2.61 | −29.36 | −8.75 |

As seen in Table 3 and FIG. 5, ΔRP becomes very small for high attenuation settings, and the corresponding switch resistance (e.g., RDSON) becomes more significant. As a result, the S11 performance of the parallel step attenuator 800 degrades for higher attenuation settings. Moreover, addressing that problem by enlarging the switches reduces the circuit bandwidth due to larger parasitics associated with the larger switches in the off state. As seen in Tables 2 and 3, the described example attenuators 110 provide improved performance while facilitating reduced switch sizes and parasitics, improved bandwidth and good S11 performance below −9 dB across the attenuation range.

FIG. 6 shows another programmable step attenuator circuit example 110B with capacitor impedance components CC formed in first and second impedance circuits 614A and 614B. In this example, the input signal source 102 includes a voltage source 104 and source resistances RS1 and RS2 as previously described. In addition, termination resistors RT are connected from the signal source output terminals to ground. The first and second switching circuits 116A and 116B in FIG. 6 operate as described above for selectable direct or cross-coupling of individual capacitors CC between one of the input nodes 112 and one of the output nodes 120. The first impedance circuit 614A includes an integer number "K" capacitors CC1-1, CC1-2, . . . , CC1-K and the second impedance circuit 614B includes "K" capacitors CC2-1, CC2-2, . . . , CC2-K. The capacitive step attenuator 110B in FIG. 6 operates as described above to provide a programmable attenuation α by selective cross coupling of one or more of the capacitors CC according to the control signals 118 from the gain controller 108. The advantages of the configurable cross-coupled attenuator impedances can thus be realized using capacitive impedances CC. In one example, the attenuation value α and S11 performance can be calculated using the above equations (1) and (2) by replacing the conductance values "g" with corresponding capacitance values "c" for frequencies at which the input signal VIN divided by the voltage of the source 104 is approximately equal to RT/(RS+RT).

The disclosed attenuator circuit examples 110, 110A and 110B and the ICs 101 facilitate better frequency response in terms of bandwidth due to smaller off state switch parasitics than the parallel resistive attenuator circuit 800 in FIG. 8. In addition, disclosed examples provide programmable attenuation as a form of configurable series impedance by cross-coupling to facilitate higher attenuations without having to use very small resistance values and large switches. In addition, the S11 performance is well controlled across a wide range of attenuation settings and remains below −9 dB.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An attenuator circuit, comprising:
    a first input node to receive a first input voltage signal;
    a second input node to receive a second input voltage signal;
    a first output node to provide a first output signal;
    a second output node to provide a second output signal;
    a first impedance circuit, including a plurality of first impedance components coupled with the first input node;
    a plurality of first switching circuits individually coupled with a corresponding one of the first impedance components, the individual first switching circuits operative to electrically connect the corresponding first impedance component to the first output node when a corresponding first control signal is in a first state, and to electrically connect the corresponding first impedance component to the second output node when the corresponding first control signal is in a second state;
    a second impedance circuit, including a plurality of second impedance components coupled with the second input node;
    a plurality of second switching circuits individually coupled with a corresponding one of the second impedance components, the individual second switching circuits operative to electrically connect the corresponding second impedance component to the first output node when a corresponding second control signal is in a first state, and to electrically connect the corresponding second impedance component to the second output node when the corresponding second control signal is in a second state; and a third impedance component coupled between the first and second output nodes, wherein the first impedance components are resistors, wherein the second impedance components are resistors, and wherein the third impedance component is a resistor.

2. The attenuator circuit of claim 1, wherein the individual first switching circuits and the individual second switching circuits include:
   a first switch coupled between the corresponding first or second impedance component and the first output node; and
   a second switch coupled between the corresponding first or second impedance component and the second output node.

3. The attenuator circuit of claim 1, wherein the first impedance components include capacitors, wherein the second impedance components include capacitors, and wherein the third impedance component includes a capacitor.

4. The attenuator circuit of claim 1, wherein the first impedance components include resistors, and wherein the second impedance components include resistors.

5. An attenuator circuit, comprising:
   an input circuit, including a first input node to receive a first input voltage signal, and a second input node to receive a second input voltage signal;
   an output circuit, including a first output node to provide a first output signal, and a second output node to provide a second output signal;
   a plurality of attenuator impedance components;
   a switching circuit operative to selectively connect at least a first one of the attenuator impedance components between the first input node and the second output node, and to selectively connect at least a second one of the attenuator impedance components between the second input node and the first output node; and
   an output impedance component coupled between the first and second output nodes,
   wherein the switching circuit is operative to selectively connect at least a third one of the attenuator impedance components between the first input node and the first output node, and to selectively connect at least a fourth one of the attenuator impedance components between the second input node and the second output node.

6. The attenuator circuit of claim 5, wherein the plurality of attenuator impedance components includes:
   a first impedance circuit including a plurality of first attenuator impedance components, the individual first attenuator impedance components including a first terminal connected to the first input node, and a second terminal; and
   a second impedance circuit including a plurality of second attenuator impedance components, the individual second attenuator impedance components including a third terminal connected to the second input node, and a fourth terminal.

7. The attenuator circuit of claim 6, wherein the switching circuit includes:
   a plurality of first switching circuits, the individual first switching circuits connected to the first and second output nodes and the second terminal of a corresponding one of the first attenuator impedance components, the individual first switching circuits operative according to at least one corresponding first control signal in a first state to electrically connect the second terminal of the corresponding first attenuator impedance component with the first output node, and the individual first switching circuits operative according to the at least one corresponding first control signal in a second state to electrically connect the second terminal of the corresponding first attenuator impedance component with the second output node; and
   a plurality of second switching circuits, the individual second switching circuits connected to the first and second output nodes and the fourth terminal of a corresponding one of the second attenuator impedance components, the individual second switching circuits operative according to at least one corresponding second control signal in a first state to electrically connect the fourth terminal of the corresponding second attenuator impedance component with the first output node, and the individual second switching circuits operative according to the at least one corresponding second control signal in a second state to electrically connect the fourth terminal of the corresponding second attenuator impedance component with the second output node.

8. The attenuator circuit of claim 7, wherein the individual first switching circuits and the individual second switching circuits include:
   a first switch coupled between the corresponding first or second attenuator impedance component and the first output node; and
   a second switch coupled between the corresponding first or second attenuator impedance component and the second output node.

9. The attenuator circuit of claim 5, wherein the attenuator impedance components are resistors, and wherein the output impedance component is a resistor.

10. The attenuator circuit of claim 5, wherein the attenuator impedance components are capacitors, and wherein the output impedance component is a capacitor.

11. An attenuator circuit, comprising:
   a first input node to receive a first input voltage signal;
   a second input node to receive a second input voltage signal;
   a first output node to provide a first output signal;
   a second output node to provide a second output signal;
   a first impedance circuit, including a plurality of first impedance components coupled with the first input node;
   a plurality of first switching circuits individually coupled with a corresponding one of the first impedance components, the individual first switching circuits operative to electrically connect the corresponding first impedance component to the first output node when a corresponding first control signal is in a first state, and to electrically connect the corresponding first impedance component to the second output node when the corresponding first control signal is in a second state;
   a second impedance circuit, including a plurality of second impedance components coupled with the second input node;
   a plurality of second switching circuits individually coupled with a corresponding one of the second impedance components, the individual second switching circuits operative to electrically connect the corresponding second impedance component to the first output node when a corresponding second control signal is in a first state, and to electrically connect the corresponding second impedance component to the second output node when the corresponding second control signal is in a second state; and a third impedance component coupled between the first and second output nodes, wherein the first impedance components are resistors, wherein the first impedance components are capacitors, wherein the second impedance components are capacitors, and wherein the third impedance component is a capacitor.

12. The attenuator circuit of claim 11, wherein the individual first switching circuits and the individual second switching circuits include:

a first switch coupled between the corresponding first or second impedance component and the first output node; and a second switch coupled between the corresponding first or second impedance component and the second output node.

13. The attenuator circuit of claim 11, wherein the first impedance components include resistors, and wherein the second impedance components include resistors.

* * * * *